(12) United States Patent
Liu et al.

(10) Patent No.: US 12,300,682 B2
(45) Date of Patent: May 13, 2025

(54) SEMICONDUCTOR PACKAGE

(71) Applicants: Kabushiki Kaisha Toshiba, Tokyo (JP); Toshiba Electronic Devices & Storage Corporation, Tokyo (JP)

(72) Inventors: Jia Liu, Yokohama (JP); Toshihiro Tsujimura, Ota (JP); Masahiko Hori, Yokohama (JP); Tatsuo Tonedachi, Yamato (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 147 days.

(21) Appl. No.: 17/651,965

(22) Filed: Feb. 22, 2022

(65) Prior Publication Data

US 2023/0080478 A1    Mar. 16, 2023

(30) Foreign Application Priority Data

Sep. 16, 2021 (JP) .................................. 2021-151260

(51) Int. Cl.
| | |
|---|---|
| *H01L 25/16* | (2023.01) |
| *H01L 23/00* | (2006.01) |
| *H01L 23/538* | (2006.01) |
| *H01L 23/66* | (2006.01) |
| *H01L 31/12* | (2006.01) |
| *H01L 23/31* | (2006.01) |

(52) U.S. Cl.
CPC ........ *H01L 25/167* (2013.01); *H01L 23/5386* (2013.01); *H01L 23/66* (2013.01);
(Continued)

(58) Field of Classification Search
CPC .... H05K 1/112; H05K 3/4038; H01L 23/538; H01L 23/5384; H01L 23/49827;
(Continued)

(56) References Cited

U.S. PATENT DOCUMENTS 5,835,646 A  *  11/1998  Yoshimura ............... G02B 6/42
                                                                    385/83
5,877,555 A     3/1999  Leighton et al.
(Continued)

FOREIGN PATENT DOCUMENTS

JP          2004-103654 A    4/2004
JP          3592722 B2        11/2004
(Continued)

OTHER PUBLICATIONS

Decision to Grant a Patent issued on Jul. 2, 2024, in corresponding Japanese Application No. 2021-151260, 6 pages.

*Primary Examiner* — Shaun M Campbell
*Assistant Examiner* — Teresa M. Arroyo
(74) *Attorney, Agent, or Firm* — Maier & Maier, PLLC

(57) ABSTRACT

A semiconductor package includes a PDA chip, a MOS chip, and a wiring plate including a first principal surface and a second principal surface, the first principal surface being provided with a first rigid plate that is non-conductive and a second rigid plate that is conductive, the PDA chip being fixed to the first rigid plate by using a non-conductive bonding agent, a lower surface terminal of the MOS chip being soldered to the second rigid plate, the second principal surface being provided with an input terminal and an output terminal, the input terminal being electrically connected to the PDA chip, the output terminal being electrically connected to the second rigid plate.

14 Claims, 3 Drawing Sheets

(52) U.S. Cl.
CPC .............. *H01L 24/48* (2013.01); *H01L 31/12* (2013.01); *H01L 23/3121* (2013.01); *H01L 2224/48247* (2013.01); *H01L 2224/85* (2013.01); *H01L 2924/15153* (2013.01)

(58) Field of Classification Search
CPC ........... H01L 23/5386; H01L 23/49503; H01L 23/66; H01L 23/3121; H01L 23/5387; H01L 25/167; H01L 2924/156; H01L 2924/181; H01L 2924/15153; H01L 24/48; H01L 24/49; H01L 24/05; H01L 24/06; H01L 24/29; H01L 24/32; H01L 24/73; H01L 31/12; H01L 2224/48247; H01L 2224/85; H01L 2224/05644; H01L 2224/0603; H01L 2224/32145; H01L 2224/32225; H01L 2224/45015; H01L 2224/45144; H01L 2224/48137; H01L 2224/48471; H01L 2224/49111; H01L 2224/4917; H01L 2224/73265; H01L 23/49506; H01L 23/49513
USPC ......................................................... 361/767
See application file for complete search history.

(56) References Cited

U.S. PATENT DOCUMENTS

| | | | | |
|---|---|---|---|---|
| 10,818,568 | B1* | 10/2020 | Huang | H02J 7/0042 |
| 2003/0002820 | A1* | 1/2003 | Nakanishi | H01S 5/02251 |
| | | | | 385/88 |
| 2003/0047807 | A1* | 3/2003 | Alcoe | H01L 23/562 |
| | | | | 257/734 |
| 2012/0074846 | A1* | 3/2012 | Marreiro | H05B 47/24 |
| | | | | 315/121 |
| 2014/0264417 | A1 | 9/2014 | Kobayashi et al. | |
| 2015/0035528 | A1* | 2/2015 | Nishioka | G01R 33/0206 |
| | | | | 324/252 |
| 2015/0069423 | A1 | 3/2015 | Yamamoto et al. | |
| 2015/0262985 | A1* | 9/2015 | Takai | H01L 31/167 |
| | | | | 257/82 |
| 2015/0263184 | A1* | 9/2015 | Takai | H01L 23/645 |
| | | | | 257/82 |
| 2016/0218087 | A1* | 7/2016 | Ye | H01L 25/16 |
| 2019/0088577 | A1* | 3/2019 | Shimoyama | H01L 23/49562 |
| 2019/0207051 | A1* | 7/2019 | Utsumi | H01L 25/167 |
| 2020/0075437 | A1 | 3/2020 | Nozu et al. | |
| 2021/0175221 | A1 | 6/2021 | Tonedachi | |
| 2022/0208656 | A1* | 6/2022 | Upadhyaya | H01L 23/50 |
| 2022/0302337 | A1* | 9/2022 | Hori | H01L 31/0203 |

FOREIGN PATENT DOCUMENTS

| | | |
|---|---|---|
| JP | 2014179457 A | 9/2014 |
| JP | 2014236140 A | 12/2014 |
| JP | 2015056531 A | 3/2015 |
| JP | 6319530 B1 | 5/2018 |
| JP | 2020035925 A | 3/2020 |
| JP | 2021089971 A | 6/2021 |

\* cited by examiner

SEMICONDUCTOR PACKAGE

CROSS-REFERENCE TO RELATED APPLICATIONS

This application is based upon and claims the benefit of priority from the prior Japanese Patent Application No. 2021-151260 filed on Sep. 16, 2021; the entire contents of which are incorporated herein by reference.

FIELD

An embodiment described herein relates generally to a semiconductor package including a contactless relay.

BACKGROUND

In a measurement device such as an IC tester, a relay is used to electrically separate a measurement target object and a measurement circuit. Conventionally, a mechanical relay including a mechanical contact point has been used. A contactless relay such as a photo relay including an optically coupled device has been increasingly used to achieve improvement of operation speed of a measurement target object, noise reduction, and high reliability.

Operation clock frequency used in an IC tester exceeds 1 GHz due to recent improvement of IC performance. It is requested that operation speed of a photo relay be sufficiently high compared to the operation speed of the measurement target object. The operation speed of a photo relay needs to be improved to follow operation speed improvement and achieve measurement efficiency improvement.

In order to improve operation speed of a semiconductor package such as a photo relay, it is important to reduce parasitic capacitance of the package.

DETAILED DESCRIPTION

A semiconductor package of an embodiment includes a first semiconductor chip, a second semiconductor chip, and a wiring plate including a first principal surface and a second principal surface opposite to the first principal surface, the first principal surface being provided with a first rigid plate that is non-conductive and a second rigid plate that is conductive, the first semiconductor chip being fixed to the first rigid plate by using a non-conductive bonding agent, a lower surface terminal of the second semiconductor chip being soldered to the second rigid plate, the second principal surface being provided with a first wire and a second wire, the first wire being electrically connected to the first semiconductor chip, the second wire being electrically connected to the second rigid plate.

A semiconductor package 1 of the embodiment will be described below in detail with reference to the accompanying drawings.

Diagrams based on the embodiment are schematic and, for example, relations among components in thickness and width, and thickness ratio and relative angle of each part are different from actual ones. Some parts have different dimensional relations and ratios among drawings. Some constituent components are not illustrated and not denoted with reference signs.

Figure 1:
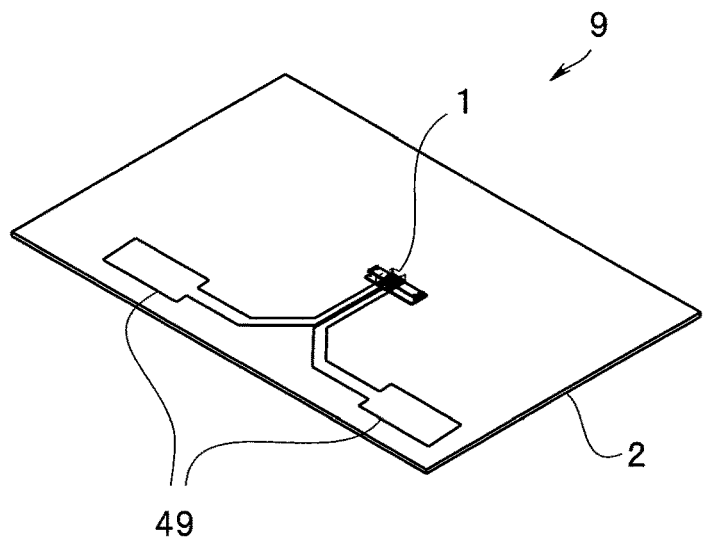
FIG. 1 is a perspective view of a semiconductor device including a semiconductor package of an embodiment.
Figure 2:
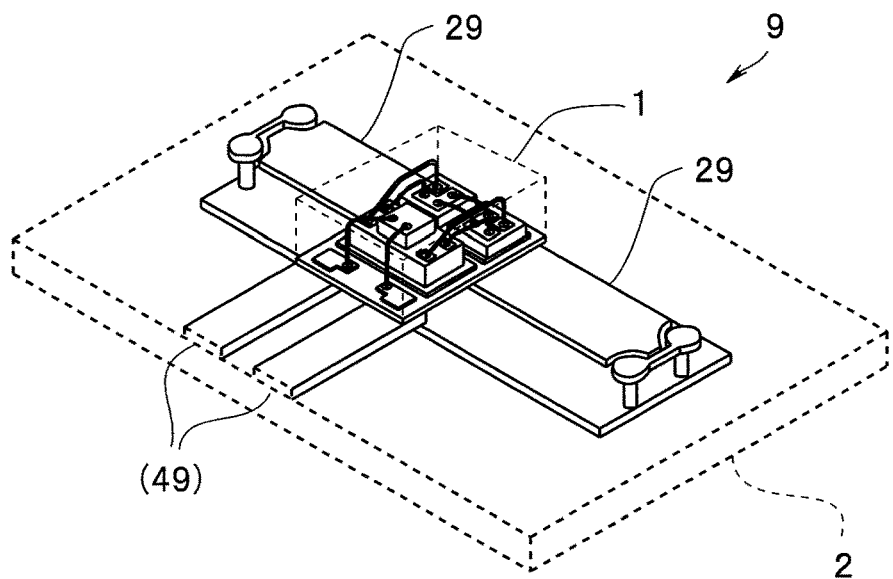
FIG. 2 is a perspective view of the semiconductor device including the semiconductor package of the embodiment.

As illustrated in FIG. 1, the semiconductor package 1 of the embodiment is mounted on a wiring plate 2 for, for example, evaluation. Electrodes 49 of the wiring plate 2 are connected to input terminals 33 (refer to FIG. 5) of the semiconductor package 1. FIG. 2 is an enlarged view of a part of FIG. 1. A lead frame 29 disposed on the wiring plate 2 is connected to output terminals 36 (refer to FIG. 5) of the semiconductor package 1.

Figure 3:
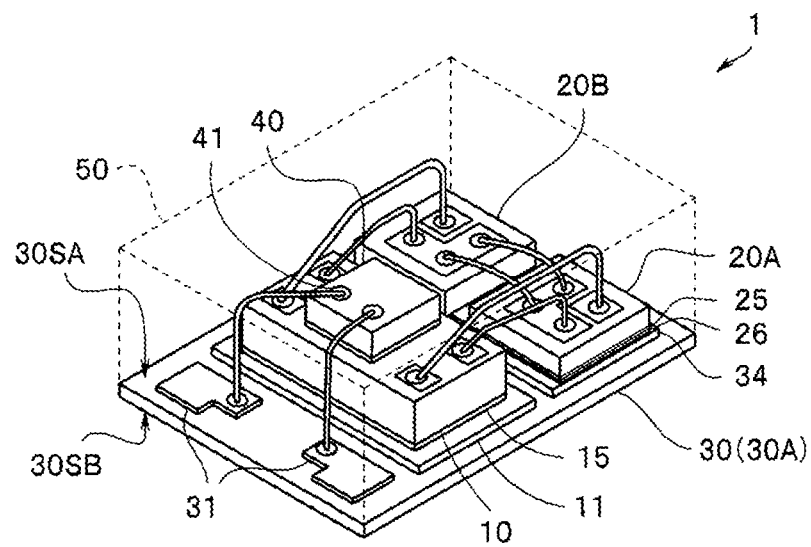
FIG. 3 is a perspective view of the semiconductor package of the embodiment.
Figure 4:
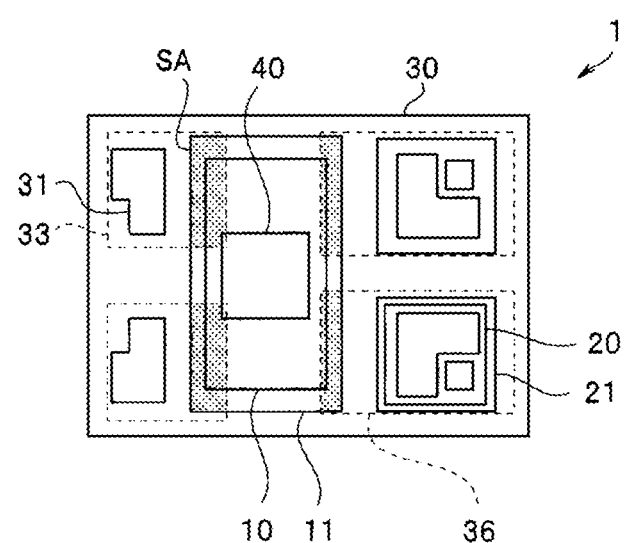
FIG. 4 is a top view of the semiconductor package of the embodiment.

As illustrated in FIGS. 3 and 4, the semiconductor package 1 includes a photodiode array chip (PDA chip) 10 as a first semiconductor chip, two MOS-FET chips (MOS chips) 20A and 20B as a second semiconductor chip, a light-emitting diode chip (LED chip) 40 as a third semiconductor chip, and a wiring plate 30. Hereinafter, the two MOS chips 20A and 20B are each referred to as a MOS chip 20.

The wiring plate 30 includes a first principal surface 30SA and a second principal surface 30SB opposite to the first principal surface 30SA. The wiring plate 30 is, for example, a flexible printed circuit made of a base 30A that is polyimide (PI) having a thickness D of 50 μm. Hereinafter, a direction of the first principal surface 30SA side of the wiring plate 30 is referred to as "up". A first rigid plate 11 that is non-conductive, two second rigid plates 34 that are conductive, and two electrodes 31 are disposed on the first principal surface 30SA of the wiring plate 30. The input terminals 33 and the output terminals 36 are disposed on the second principal surface 30SB of the wiring plate 30 (refer to FIG. 5).

The PDA chip 10 is fixed to the non-conductive first rigid plate 11 by using a non-conductive bonding agent 15. For example, the first rigid plate 11 is made of epoxy resin having a thickness of 100 μm. The PDA chip 10 includes a photodiode array and a control circuit. A light-emitting surface of the LED chip 40 is fixed to a light-receiving surface as an upper surface of the PDA chip 10 by using transparent resin 45 such as silicone. The PDA chip 10 generates voltage by receiving light emitted by the LED chip 40.

The MOS chips 20 are fixed to the conductive second rigid plates 34 by using a conductive material 26 such as solder or a conductive bonding agent. For example, the second rigid plates 34 are made of copper having a thickness of 50 μm.

Terminals 41 on an upper surface of the LED chip 40 are connected to the electrodes 31 of the wiring plate 30 through bonding wires. A plurality of electrodes on the upper surface of the PDA chip 10 are connected to a gate terminal G and a source terminal S, respectively, on an upper surface of each MOS chip 20 through bonding wires.

The electrodes 31 of the wiring plate 30 are connected to the input terminals 33 of the second principal surface 30SB via through wirings 32. Drain terminals (D) 25 as lower surface terminals on the MOS chips 20 are connected to the output terminals 36 of the second principal surface 30SB via the conductive material 26, the second rigid plates 34, and through wirings 35.

A plurality of semiconductor chips (dies) such as the MOS chips 20 disposed on the first principal surface 30SA are sealed by molding resin 50 such as thermosetting epoxy resin. The semiconductor package 1 includes the input terminals 33 and the output terminals 36 on the second principal surface 30SB.

Manufacturing Method

In a method of manufacturing the semiconductor package 1, the wiring plate 30 is produced first. The through wirings 35 are disposed by, for example, laser perforation and through-hole plating on a printed substrate made of polyimide as the base 30A and having copper foils disposed on both surfaces. The copper foils are patterned to produce the electrodes 31 and the second rigid plates 34 on the first principal surface 30SA and produce the input terminals 33 and the output terminals 36 on the second principal surface 30SB. The electrodes 31 and the second rigid plates 34 are connected to the input terminals 33 and the output terminals 36, respectively, through the through wirings 32 and 35.

On the second rigid plates 34, metal plates made of copper or aluminum may be additionally disposed on copper patterns produced through the copper foil patterning. The first rigid plate 11 as an epoxy resin plate having a thickness of 100 µm is disposed at a predetermined position on the first principal surface 30SA.

Figure 5:
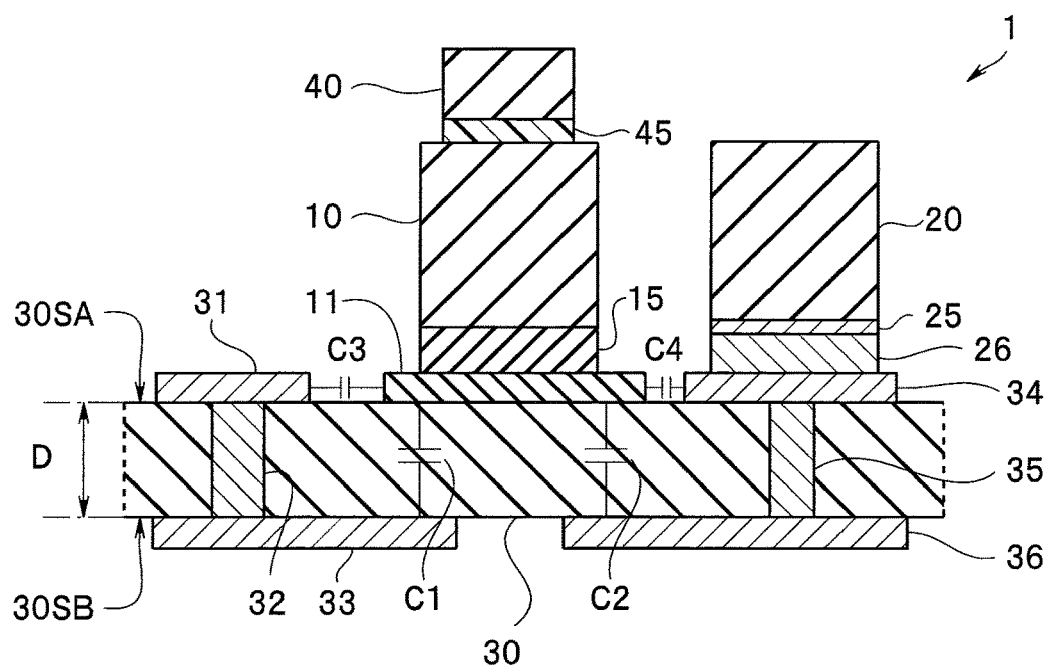
FIG. 5 is a cross-sectional view of the semiconductor package of the embodiment.
Figure 6:
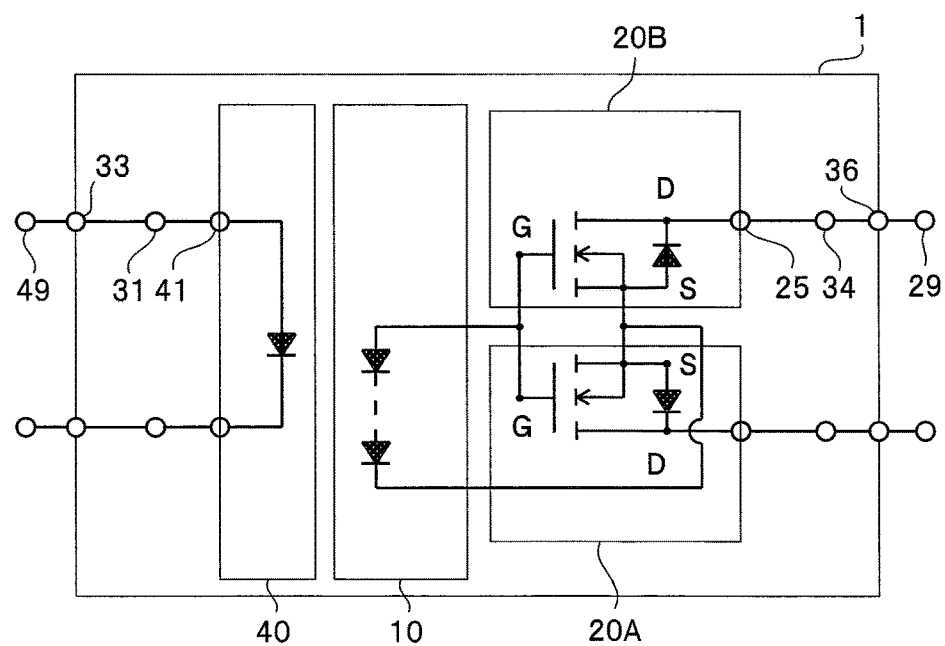
FIG. 6 is a circuit diagram of the semiconductor package of the embodiment.

The input terminals 33 and the output terminals 36 preferably have large area to assure reliability of junction with the lead frame 29 and the wiring plate 2. Thus, as illustrated in FIG. 5, the input terminals 33 and the output terminals 36 each have an overlapping region SA in transparent view from above with the first rigid plate 11 of the first principal surface 30SA.

The PDA chip 10 is fixed to the first rigid plate 11 of the wiring plate 30 by using the bonding agent 15. The LED chip 40 is fixed to the light-receiving surface of the PDA chip 10 by using transparent resin. The two MOS chips 20 are fixed to the respective second rigid plates 34 by using solder as the conductive material 26. In other words, the drain terminals 25 as the lower surface terminals of the MOS chips 20 are joined to the second rigid plates 34.

Wire bonding is provided between each terminal 41 of the LED chip 40 and a corresponding electrode 31 by using, for example, a gold line having a diameter of 100 µm. Wire bonding is provided between each terminal of the PDA chip 10 and a corresponding terminal of each MOS chip 20 and between terminals of the two MOS chips 20. The terminals of each semiconductor chip are preferably gold-plated on a surface.

The first principal surface 30SA of the wiring plate 30 on which the PDA chip 10, the MOS chips 20, and the LED chip 40 are mounted is sealed by using the molding resin 50 to complete production of the semiconductor package 1.

Operation

Operation of the semiconductor package 1 will be briefly described below. When an input signal is input through the input terminals 33, the LED chip 40 generates an optical signal. When having received the optical signal, the PDA chip 10 generates a voltage signal. When the voltage signal is applied to the gate terminals of the MOS chips 20, the drain terminals 25 of the MOS chips 20 switch to an "ON" mode. When the voltage signal applied to the gate terminals of the MOS chips 20 decreases, the drain terminals 25 of the MOS chips 20 switch to an "OFF" mode. The drain terminals 25 are connected to the output terminals 36.

The semiconductor package 1 is a photo relay configured to repeat "ON" and "OFF" in accordance with the input signal. The input terminals 33 are insulated from the output terminals 36, and thus voltage of a circuit on the input terminal side is not applied to a circuit on the output terminal side.

Each conductive second rigid plate 34 is called, for example, a die pad. For example, a die pad having a thickness larger than 50 µm and smaller than 500 µm is necessary for supporting and fixing a semiconductor chip at a predetermined position on a flexible substrate. However, as illustrated in FIG. 5, when conductive rigid plates are used as die pads in the PDA chip 10 as in the MOS chips 20, parasitic capacitance C1 is generated between a die pad and a corresponding input terminal 33, and parasitic capacitance C2 is generated between a die pad and a corresponding output terminal 36. In addition, parasitic capacitances C3 and C4, which are small as compared to parasitic capacitances C1 and C2, are generated between a conductive rigid plate and a corresponding electrode 31 and between a conductive rigid plate and a corresponding second rigid plate 34, respectively.

As already described, the input terminals 33 and the output terminals 36 are extended to a second region of the second principal surface 30SB on an opposite side across the base 30A in a first region in which the first rigid plate 11 is disposed on the first principal surface 30SA. Accordingly, the input terminals 33 and the output terminals 36 each have the overlapping region SA as already described. A semiconductor package including a conductive first rigid plate has particularly large parasitic capacitance due to the first rigid plate.

In the semiconductor package 1, the non-conductive first rigid plate 11 is used as a die pad for fixing the PDA chip 10 to a flexible substrate. Accordingly, no parasitic capacitances C1 to C4 are generated in the semiconductor package 1. The semiconductor package 1 having reduced parasitic capacitance exhibits high performance.

The parasitic capacitances C1 and C2 are larger as the thickness D of the base 30A of the wiring plate 30 is smaller. Thus, effects of the present invention are significant when the thickness D of the base 30A of the wiring plate 30 is smaller than 100 µm to reduce height of the semiconductor package 1. Note that the base 30A of the wiring plate 30 preferably has a small dielectric constant for parasitic capacitance reduction and is further preferably made of, for example, PI, PPE, or PTFE, which are materials having a specific dielectric constant (ASTM D150) k of 3.5 or smaller.

The thickness of the first rigid plate 11 is preferably larger than several tens µm to stably hold the PDA chip 10. Moreover, the bonding agent for fixing the PDA chip 10 to the first rigid plate 11 is preferably non-conductive to generate no parasitic capacitance. In other words, no conductive layer is preferably disposed in the first region in which the first rigid plate 11 is disposed on the first principal surface 30SA.

The first rigid plate 11 preferably functions as a positioning member for disposing the PDA chip 10 at a predetermined position on the wiring plate 30. Therefore, the first rigid plate 11 is preferably slightly larger than the PDA chip 10 and made of a non-transparent material. For example, the first rigid plate 11 is epoxy resin containing colorant. When the PDA chip 10 disposed on the first rigid plate 11 is observed from above, for example, the first rigid plate 11 having a width of 100 μm is preferably exposed outside each of four side surfaces of the PDA chip 10 so that the first rigid plate 11 can be observed. No parasitic capacitance is generated even when the first rigid plate has large area since the first rigid plate 11 is non-conductive.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor package comprising:
a first semiconductor chip;
a second semiconductor chip;
a wiring plate being a flexible substrate, the wiring plate including a first principal surface and a second principal surface opposite to the first principal surface;
a first rigid plate provided on the first principal surface, the first rigid plate being a non-conductive die pad on which the first semiconductor chip is directly fixed via a non-conductive bonding agent;
a second rigid plate provided on the first principal surface, the second rigid plate being a conductive die pad on which a lower surface terminal of the second semiconductor chip is directly soldered; and
an input terminal and an output terminal, the input terminal being electrically connected to the first semiconductor chip, the output terminal being electrically connected to the second rigid plate,
wherein each of the input terminal and the output terminal at least partially overlaps with the first rigid plate via the wiring plate.

2. The semiconductor package according to claim 1, wherein no conductive layer is disposed in a first region in which the first rigid plate is disposed on the first principal surface.

3. The semiconductor package according to claim 2, wherein the input terminal and the output terminal are extended to a second region on the second principal surface, the second region being opposite to the first region.

4. The semiconductor package according to claim 1, wherein the first rigid plate is made of a non-transparent material.

5. The semiconductor package according to claim 1, wherein a base of the wiring plate has a thickness smaller than 100 μm.

6. The semiconductor package according to claim 1, further comprising a light-emitting diode chip as a third semiconductor chip configured to generate an optical signal, wherein the first semiconductor chip is a photodiode array chip configured to receive the optical signal, and
the second semiconductor chip is a MOS-FET chip.

7. The semiconductor package according to claim 6, wherein a base of the wiring plate has a specific dielectric constant equal to or smaller than 3.5.

8. The semiconductor package according to claim 7, wherein the base of the wiring plate is polyimide.

9. The semiconductor package according to claim 6, wherein an outer peripheral part of the first rigid plate made of a non-transparent material is exposed outside each of four side surfaces of the photodiode array chip.

10. The semiconductor package according to claim 6, wherein the second rigid plate has a thickness larger than 50 μm and smaller than 500 μm.

11. The semiconductor package according to claim 1, wherein the first rigid plate comprises epoxy resin.

12. A semiconductor package comprising:
a first semiconductor chip;
a second semiconductor chip;
a wiring plate being a flexible substrate, the wiring plate including a first principal surface and a second principal surface opposite to the first principal surface;
a first rigid plate provided on the first principal surface, the first rigid plate being a non-conductive die pad on which the first semiconductor chip is directly fixed via a non-conductive bonding agent;
a second rigid plate provided on the first principal surface, the second rigid plate being a conductive die pad on which a lower surface terminal of the second semiconductor chip is directly soldered; and
an input terminal and an output terminal, the input terminal being electrically connected to the first semiconductor chip, the output terminal being electrically connected to the second rigid plate,
wherein a base of the wiring plate has a thickness smaller than 100 μm, the base comprising polyimide, and
wherein each of the input terminal and the output terminal at least partially overlaps with the first rigid plate via the wiring plate.

13. The semiconductor package according to claim 1, further comprising an electrode provided on the first principal surface of the wiring plate, the electrode being electrically connected to the input terminal via a through wiring of the wiring plate,
wherein the first rigid plate is located between the second rigid plate and the electrode.

14. The semiconductor package according to claim 6, wherein
the second semiconductor chip is constituted by a plurality of MOS-FET chips, and
the second rigid plate and the output terminal are constituted by a plurality of rigid plates and a plurality of output terminals, respectively, each corresponding to the plurality of MOS-FET chips.

* * * * *